United States Patent [19]

Sims

[11] 4,308,857
[45] Jan. 5, 1982

[54] EVACUATED ENVELOPE AND SOLAR ENERGY RECEIVER

[75] Inventor: William H. Sims, Cedar Falls, Iowa

[73] Assignee: Chamberlain Manufacturing Corporation, Elmhurst, Ill.

[21] Appl. No.: 77,352

[22] Filed: Sep. 20, 1979

[51] Int. Cl.³ ............................................... F24J 3/02
[52] U.S. Cl. .................................. 126/443; 126/447; 165/168
[58] Field of Search ................ 126/443, 447; 165/168, 165/171

[56] References Cited

U.S. PATENT DOCUMENTS

| | | | |
|---|---|---|---|
| 1,375,474 | 4/1921 | Snelling | 136/252 |
| 2,083,317 | 6/1937 | Dallenbach | 73/355 R |
| 3,227,153 | 1/1966 | Godel | 126/443 |
| 3,475,660 | 10/1969 | Goblenz | 317/234 |
| 3,990,914 | 11/1976 | Weinstein et al. | 136/89 |
| 4,043,318 | 8/1977 | Pei | 126/443 |
| 4,045,245 | 8/1977 | Coleman et al. | 136/89 C |
| 4,056,405 | 11/1977 | Varadi | 136/89 PC |
| 4,067,764 | 1/1978 | Walker et al. | 156/267 |
| 4,069,812 | 1/1978 | O'Neill | 350/211 |
| 4,078,944 | 3/1978 | Mlavsky | 136/89 H |
| 4,081,289 | 3/1978 | Campbell | 136/89 PC |
| 4,124,019 | 11/1978 | Heffelfinger | 126/443 |
| 4,180,055 | 12/1979 | Hudnall | 126/443 |

Primary Examiner—Ronald C. Capossela
Attorney, Agent, or Firm—Hill, Van Santen, Steadman, Chiara & Simpson

[57] ABSTRACT

A solar energy receiver comprising an evacuated glass envelope in which is mounted an extruded aluminum energy receiving member through which fluid conducting tubes are inserted and then expanded so as to create a mechanical bond between the tubing and the aluminum extrusion to provide for good heat conductivity and wherein headers are connected to the fluid carrying conduits to supply fluid to and from the tubes. In one embodiment, photovoltaic devices are mounted on the extrusion and electrical energy is removed therefrom and the receiver is placed in an energy concentrator so as to derive the maximum available energy.

15 Claims, 7 Drawing Figures

EVACUATED ENVELOPE AND SOLAR ENERGY RECEIVER

BACKGROUND OF THE INVENTION

1. Field of the Invention

This invention relates in general to evacuated envelopes for receiving solar energy.

2. Description of the Prior Art

Many attempts have been made to provide apparatus for converting solar energy into either heat where it can be used or directly into electrical energy by using photovoltaic devices. Such devices when used in the earth's atmosphere, are subject to degradation due to environmental factors. Also, it is important that photovoltaic devices do not become overheated as "thermal runaway" will ultimately destroy the devices and their characteristics.

SUMMARY OF THE INVENTION

The present invention comprises a solar energy receiver having an evacuated transparent envelope such as glass in which is mounted a solar receiver that is formed of extruded metal as, for example, aluminum through which passages are formed and in which are mounted fluid conducting tubes which pass through the openings in the extrusion and which have been expanded so as to form tight metal bonds with the extrusion so as to provide high thermal conductivity between fluid in the tubes and the extrusion.

The present invention provides a controlled atmosphere such as vacuum or an inert gas enclosed in an envelope surrounding the solar energy receiver which comprises a high electrical conductivity heat sink such as an aluminum extrusion formed with a plurality of openings through which fluid conduits such as copper tubing is passed. The copper tubing is expanded by applying hydraulic pressure to expand it or by drawing a mechanical expander through the tube so as to force a mechanical bond by slightly working the tube and the aluminum receiver. Headers are attached to the copper tubes and fluid is passed through the receiver so as to prevent it from overheating and also to remove the thermal energy. In some embodiments, photovoltaic devices are mounted on the receiver so as to directly convert solar energy into electrical energy and the fluid is used to cool the device for maintaining thermal control. The solar receiver may be mounted in a high concentration ratio compound parabolic concentrator. The fluid passages pass through the glass envelope with suitable glass to metal seals.

Other objects, features and advantages of the invention will be readily apparent from the following description of certain preferred embodiments thereof, taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
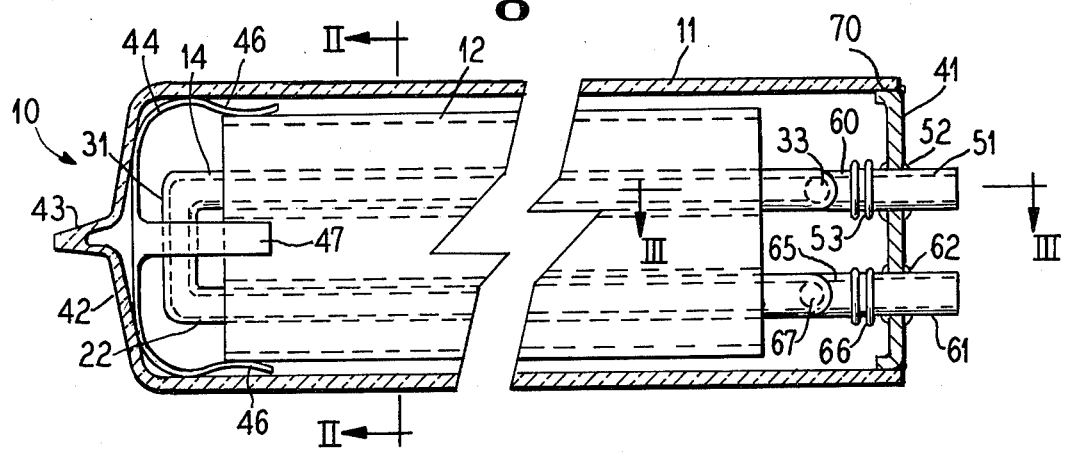
FIG. 1 is a sectional view illustrating a solar energy receiver according to a first embodiment of the invention.
Figure 2:
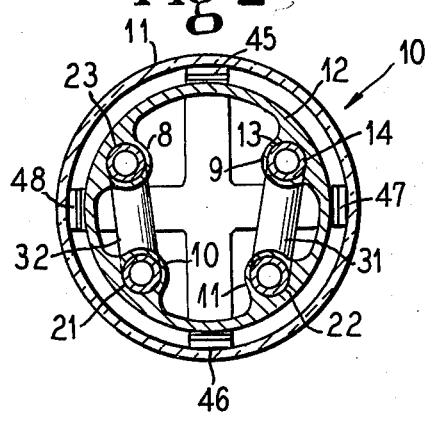
FIG. 2 is a sectional view taken on line II—II in FIG. 1.
Figure 4:
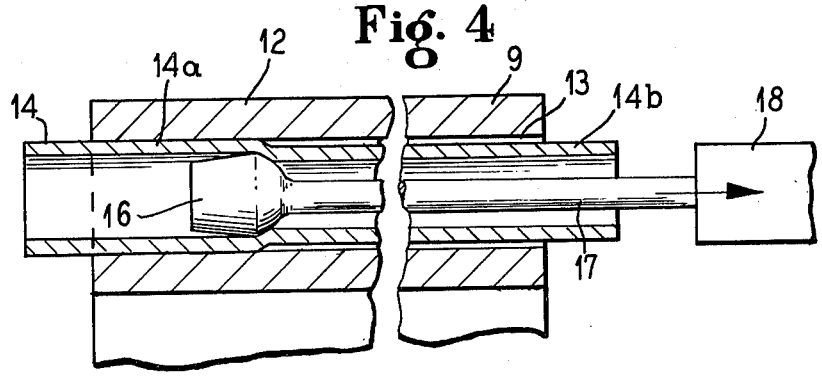
FIG. 4 is an enlarged detail sectional view illustrating the method of mechanically bonding a copper tube to the aluminum receiver.

FIG. 1 illustrates a first embodiment of a solar collector designated generally as 10 which comprises a glass envelope 11 in which is mounted a metal hollow extrusion 12 which is generally cylindrical in shape and has thin walls. Integrally formed openings are formed in portions 8, 9, 10 and 11 as shown in FIG. 2 in the internal surface of the aluminum cylinder 12 and fluid conduits as, for example, copper tubes 14, 22, 21 and 23 are received in the openings formed in portions 8, 9, 10 and 11. In order to provide a very tight mechanical bond between the copper tubing 14 and the extrusion 12 the tube 14 is expanded with a mechanical expander 16 as shown in FIG. 4 which is drawn with a rod 17 and a driving means 18 through the tube 14 such that the portion 14a after which it has passed through the tube is in tight intimate contact with the member 12. This tight contact assures that heat will flow in a very efficient manner from the member 12 through the tube 14 and into cooling fluid and heat removing fluid contained in the tube 14 in operation. Although a metal expander has been shown as the method of expanding the tube 14, it is to be realized, of course, that the tube can be expanded by applying hydraulic or fluid pressure to the tubes to expand them.

Figure 3:
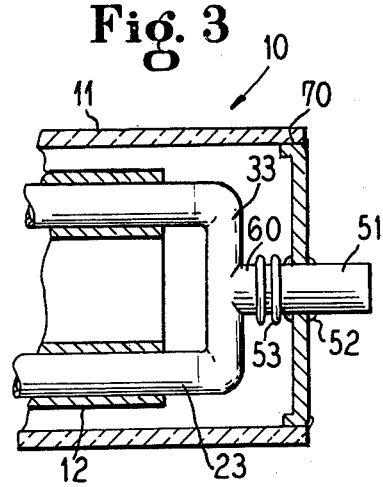
FIG. 3 is a partial sectional view taken on line III—III from FIG. 1.

Headers are then attached to each end of the tubes 14, 22, 21 and 23. For example, the left end relative to FIG. 1 of tube 14 is connected by conduit 31 to the left end of tube 22 and the left end relative to FIG. 1 of tube 23 is connected by conduit 32 to tube 21. A header 33 is connected to tubes 14 and 23 as shown in FIG. 3 at the right end of FIG. 1 and a header 67 is connected to the tubes 21 and 22 at the right end of FIG. 1. A short conduit 60 is connected to the header 33 as shown in FIG. 3 and an expandable bellows 53 is connected to the tube 60 and the other side of the bellows 53 is connected to tube 51 which passes through an end cap 41 with a brazed seal 52. Header 67 is connected to short tube 65 which connects to expandable bellows 66 which connects to tube 61 and passes through end cap 41 with a brazed seal 62. The metal end cap 41 is connected to the glass envelope 11 with a Kovar or other glass to metal seal 70.

A spring positioning holder 44 is formed with flexible legs 45, 47, 46 and 48 and is engageable with the left end relative to FIG. 1 of the member 12 so as to position the member 12 within the envelope as shown. The assembly has the end support 44 placed over it before it is inserted into the glass enclosure 11 and after the seals 52, 62 and 70 are made, the glass enclosure 11 is drawn to a suitable vacuum as, for example, $10^{-4}$ to $10^{-6}$ torr absolute vacuum through a pumping port 43 which is sealed after the gas has been removed. A suitable getter may be placed in the envelope prior to baking so as to obtain and maintain the ultimate vacuum.

The bellows 53 and 66 allow for thermal expansion in the envelope and adjust the length of the internal structure depending upon the temperature within the envelope.

Figure 5:
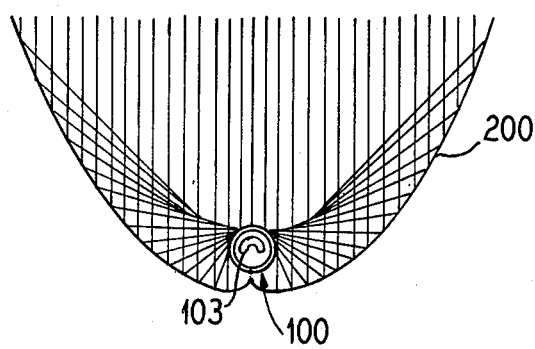
FIG. 5 illustrates a high concentration ratio compound parabolic concentrator with the receiver of the invention mounted therein.
Figure 7:
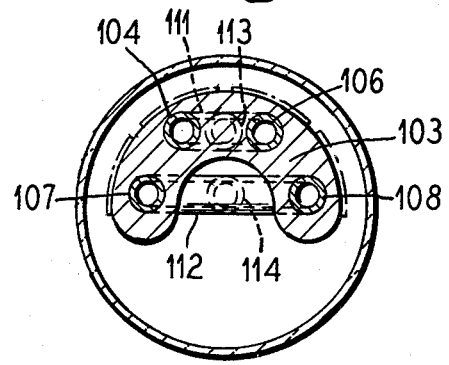
FIG. 7 is a sectional view taken on line VII—VII from FIG. 6.
Figure 6:
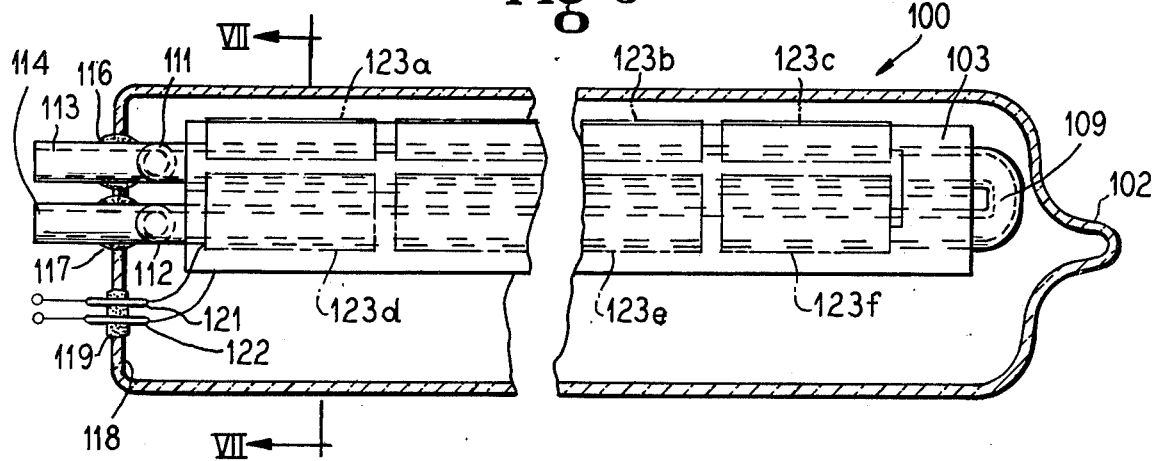
FIG. 6 is a sectional view of a second embodiment of the invention.

FIGS. 5, 6 and 7 illustrate a modification of the invention wherein the heat receiver may be placed within a high concentration ratio compound parabolic concentrator 200 so that incoming solar energy will be concentrated on the receiver 100. In this embodiment the receiver carries a plurality of photovoltaic devices 123 which are mounted on a heat sink 103 that might be of aluminum or other suitable material and devices 123 are electrically connected together in a series and parallel arrangement so as to develop the desired voltage and current capacity. The photovoltaic devices are connected by leads 121 and 122 which pass through a Kovar or other glass to metal electrical feed through seal 119 which passes through the end 118 of the glass envelope 101. The aluminum extrusion 103 is formed with a plurality of openings into which metal tubes such as, for example, copper, and designated 104, 106, 107, 108 are placed and then the copper tubing is expanded either with a suitable expander as illustrated in FIG. 4 or by applying fluid pressure thereto to cause a tight seal between the tubes and the extrusion 103. Header 111 is connected between tubes 104 and 106 at the left end of FIG. 6 and header 112 between tubes 107 and 108 at the left end of FIG. 6. A vertical header 109 is connected between the opposite ends of tubes 104, 106 and tubes 107 and 108 such that fluid can pass through an input pipe 113 which extends through the glass envelope end 118 with a Kovar or other type of glass to metal seal and which then connects through the header 111 to allow fluid to pass through the tubes 104 and 106. At the right end relative to FIG. 6, the fluid passes from tubes 104 and 106 through the header 109 to the right ends of tubes 107 and 108 and the fluid then passes to the left relative to FIG. 6 and through the header 112 to an output conduit 114 which extends through the end 118 of the glass envelope 101 with a suitable glass to metal seal as, for example, the Kovar or other types of seals 116 and 177.

The receiver 100 is then mounted in the compound parabolic concentrator 200 as illustrated in FIG. 5 so that the incoming energy is received by the photovoltaic devices 123 and electrical energy is generated by the thermal energy. The extrusion 103 which is generally crescent shaped as illustrated in FIG. 7 is cooled so that it does not exceed the desired temperatures by the fluid passing through the various headers in the tubes 104, 106, 107 and 108 and due to the good thermal contact between the aluminum extruded member 103 and the copper tubes 104, 106, 107 and 108 the heat flow will be very efficient. The expansion of the tubes also prevents movement of the tubes relative to the extrusion.

The outer surface of the extrusion 103 upon which the photovoltaic devices 123 are mounted may be formed with faceted surfaces running parallel to the longitudinal axis on the outside of the semicircular element 103 which illustrates the thermal energy impinging upon the receiver 103.

It has been discovered that with a compound parabolic concentrator that the receiving area of the energy is not a cylinder but two very small segments of a cylinder. For a concentrator the concentration ratio C.R. is defined as the aperture width divided by the receiver circumference (length of surface capable of reradiation). The following chart gives examples of six models which have a design concentration ratio C.R. and actual concentration ratio C.R. The design C.R. determines the acceptance angle for the incoming energy and the truncated height is utilized to determine the actual aperture width and the resultant C.R. In the models a 1.5 inch diameter receiver was utilized.

| MODEL | DESIGN C.R. | TRUNCATION HEIGHT (INCHES) | ACTUAL C.R. |
|---|---|---|---|
| 1 | 10:1 | 20.9 | 5.34 |
| 2 | 20:1 | 31.9 | 7.05 |
| 3 | 10:1 | 10.2 | 3.89 |
| 4 | 10:1 | 7.0 | 3.28 |
| 5 | 20:1 | 10.4 | 4.16 |
| 6 | 20:1 | 7.1 | 3.47 |

The major discovery is that the receiving surface is always above the horizontal axis for the assumed conditions. Because the design C.R. is very large, resulting in a relatively small acceptance angle, only incoming radiation which is normal to the aperture plane is assumed. That is, the collector is assumed to be a tracking system, remaining constantly in a position which gives essentially nothing but parallel rays of radiant energy impinging upon the aperture plane at an angle of 90 degrees (within the accuracy of the assumption that the sun's radiation angle is 0 degrees).

Models 1–6 indicate that the receiver design is critical to the C.R. chosen and the truncation height. For example, using Model 3 it can be seen that the receiving surface is not a cylinder, but two very small segments of a cylinder. Optimistically, the maximum angle subtended by the receiving surface is a maximum of 60 degrees on either side, or a total of 120 degrees receiving surface. Since the conventional definition of concentration ratio is the ratio of the aperture width to the circumference of the receiver, the arc length of the receiver surface is the denominator. If, from Model 5 the arc length of the receiving surface is used to define the C.R., since this arc length is only ⅓ that of the cylindrical receiver, the actual C.R. can be stated as being 11.66:1 instead of 3.89:1. The design C.R. was only 10:1 initially. Thus the design of the receiver is strongly affected by the selected C.R. for the initial design.

A coating for absorption of radient heat may be placed on the extrusions so as to increase the efficiency of the devices.

Although the invention has been described with respect to preferred embodiments, it is not to be so limited as changes and modifications can be made which are within the full intended scope of the invention as defined by the appended claims.

I claim as my invention:

1. A solar energy collector comprising, an envelope transparent to solar radiation, a body member of high thermal conductivity mounted in said envelope and formed with a plurality of openings, a plurality of metal tubes extending through said plurality of openings in said body member and the outer walls of said tubes in tight physical contact with the walls within said openings of said body member, input and output conduits passing through said envelope and sealed thereto and connected to said tubes for supplying to and removing fluid from said collector, and other tubes interconnecting said plurality of tubes to form a fluid sealed path between said input and output conduits.

2. A solar collector according to claim 1 wherein said body member is a hollow cylinder.

3. A solar collector according to claim 2 wherein said plurality of openings are formed longitudinally in said cylinder.

4. A solar collector according to claim 3 wherein said plurality of openings are equally spaced in said body member.

5. A solar collector according to claim 1 wherein said body member is crescent shaped.

6. A solar collector according to claim 5 wherein said plurality of openings are formed longitudinally in said crescent shaped body member.

7. A solar collector according to claim 6 wherein said plurality of openings are equally spaced in said crescent shaped body member.

8. A solar collector according to claim 7 including a parabolic reflector and said envelope mounted at the focal point of said reflector.

9. A solar collector according to claim 1 wherein said body member comprises an aluminum extrusion.

10. A solar collector according to claim 1 wherein said plurality of tubes are copper.

11. A solar collector according to claim 1 wherein said plurality of tubes are caused to be in tight physical contact with the walls within said openings by expanding said tubes after they are within said body member.

12. A solar collector according to claim 1 including a pair of hollow flexible bellows mounted in said envelope and one of them between said input conduit and said tubes and the other one between said output conduit and said pipes.

13. A solar collector according to claim 1 including a flexible holder and spacer member within said envelope engageable with said body member to hold it relative to said envelope.

14. A solar collector according to claim 1 including a plurality of photovoltaic devices mounted on said body member.

15. A solar collector according to claim 1 wherein said envelope is sealed by a metal cover member through which said input and output conduits pass.

* * * * *

UNITED STATES PATENT AND TRADEMARK OFFICE
CERTIFICATE OF CORRECTION

PATENT NO. : 4,308,857
DATED : January 5, 1982
INVENTOR(S) : William H. Sims

It is certified that error appears in the above—identified patent and that said Letters Patent is hereby corrected as shown below:

Column 2, line 64, after "example" "$10^{31}$ $^4$ to $10^{-6}$" should read --$10^{-4}$ to $10^{-6}$.

Column 3, line 42, at the end of the line "177" should read --117--.

Column 4, line 47, "radient" should read --radiant--.

Signed and Sealed this

Twenty-second Day of June 1982

[SEAL]

Attest:

GERALD J. MOSSINGHOFF

Attesting Officer    Commissioner of Patents and Trademarks